United States Patent
Sundararajan et al.

(10) Patent No.: US 7,478,356 B1
(45) Date of Patent: Jan. 13, 2009

(54) TIMING DRIVEN LOGIC BLOCK CONFIGURATION

(75) Inventors: Priya Sundararajan, State College, PA (US); Sridhar Krishnamurthy, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 376 days.

(21) Appl. No.: 11/241,314

(22) Filed: Sep. 30, 2005

(51) Int. Cl.
*G06F 17/50* (2006.01)

(52) U.S. Cl. .............................. 716/16; 716/12; 716/13; 716/14; 716/15; 716/17

(58) Field of Classification Search .............. 716/12–17
See application file for complete search history.

(56) References Cited

U.S. PATENT DOCUMENTS

| | | | | |
|---|---|---|---|---|
| 4,873,630 | A * | 10/1989 | Rusterholz et al. .............. | 712/3 |
| 6,086,631 | A * | 7/2000 | Chaudhary et al. ............ | 716/16 |
| 6,487,648 | B1 * | 11/2002 | Hassoun ..................... | 711/167 |
| 7,117,277 | B2 * | 10/2006 | Mathewson et al. ........... | 710/58 |
| 7,234,044 | B1 * | 6/2007 | Perry .......................... | 712/228 |
| 2005/0132316 | A1 * | 6/2005 | Suaris et al. .................. | 716/11 |

OTHER PUBLICATIONS

Xilinx, Inc.; "ExtremeDSP Design Considerations User Guide"; UG073 (v1.2), Feb. 4, 2005; available from Xilinx, Inc., 2100 Logic Drive, San Jose, California 95124; pp. 1-54.

* cited by examiner

*Primary Examiner*—Jack Chiang
*Assistant Examiner*—Naum B Levin
(74) *Attorney, Agent, or Firm*—Kevin T. Cuenot

(57) ABSTRACT

A method of configuring a logic block of a programmable logic device (PLD) during physical implementation of a circuit design, wherein ports of the logic block are selectively registered, can include identifying the logic block of the PLD, wherein the logic block is located on a critical path. For each of a plurality of selectively registerable portions of the logic block, the method can include computing input slacks and output slacks based upon potential register usage within the logic block. The method further can include determining register usage for the logic block by maximizing a function which depends upon a measure of worst case slack for pipeline stages.

17 Claims, 4 Drawing Sheets

TIMING DRIVEN LOGIC BLOCK CONFIGURATION

BACKGROUND

1. Field of the Invention

The present invention relates to the field of integrated circuits and, more particularly, to configuring logic blocks of programmable logic devices.

2. Description of the Related Art

Programmable logic devices (PLD's) such as field programmable gate arrays (FPGA's) can include an assortment of different types of components such as memories, central processing units, and the like. Increasingly, "black boxes", also referred to as logic blocks, have been introduced into these devices to enhance application specific performance. One type of "black box" is, for example, a digital signal processor (DSP) block. Traditionally, logic block performance, and particularly DSP block performance, has been optimized during the synthesis phase of circuit design. During synthesis, a Hardware Description Language (HDL) design definition of a circuit is processed to generate the logical or physical representation of the circuit design for the targeted PLD.

When implementing a circuit design using a PLD, behavioral HDL traditionally has been mapped onto logic blocks of the target device. In illustration, Xilinx, Inc. of San Jose, Calif. manufactures various PLD's such as the Xilinx® Virtex4 family of FPGA's. These devices provide a plurality of different configurable logic blocks as described above. One particular type of logic block available on Virtex4 devices is the DSP48 block. This type of logic block provides standardized DSP functions and is highly configurable. A DSP48 block combines an 18-bit by 18-bit signed multiplier with a 48-bit adder and a programmable multiplexer which allows input to be selected for the adder. A description is disclosed in the XtremeDSP Design Considerations User Guide, UG073 (v1.2) Feb. 4, 2005 from Xilinx, Inc., pages 1-54, which is herein incorporated by reference.

Other aspects of a DSP48 block can be selected as well. For example, one group of parameter settings indicates whether ports of the logic block are registered and the amount of pipelining used for a given port. That is, input ports, output ports, and certain internal logic of the DSP48 block can be registered with varying amounts of pipelining being applied to each. More particularly, optional input, output, and multiplier pipeline registers can be selectively configured for a given circuit design.

Like other types of logic blocks, each DSP48 block usually is configured by mapping behavioral HDL onto the logic block. Determinations as to whether a port is registered and the amount of pipelining used for a given port are made during the synthesis phase of circuit design. During synthesis, however, accurate signal delay and block delay information has not yet been determined. In consequence, the configuration of logic blocks is not timing driven. Without the availability of timing information, configuration and/or optimization of logic blocks, and particularly DSP blocks, can be difficult.

It would be beneficial to provide a technique for optimizing logic blocks, including DSP blocks, of a PLD which overcomes the limitations described above.

SUMMARY OF THE INVENTION

The present invention provides a solution for configuring and/or optimizing a logic block of a programmable logic device (PLD) in a timing driven manner. One embodiment of the present invention can include a method of configuring a logic block of a PLD during physical implementation of a circuit design. An exemplary embodiment of the present invention can be used to configure and/or optimize logic blocks that have portions which can be selectively registered. The method can include identifying a logic block of the PLD that is located on a critical path, and, for each of a plurality of selectively registerable portions of the logic block, computing input slacks and output slacks based upon potential register usage within the logic block. The method further can include determining register usage for the logic block by maximizing a function which depends upon a measure of worst case slack for pipeline stages, thereby improving performance with respect to timing.

In one aspect of the invention, the input slack for each selectively registerable portion can depend upon a product of a value indicating whether a register associated with the selectively registerable portion is used and an amount of time needed to load an input value into the register associated with the selectively registerable portion. The input slack for the each selectively registerable portion further can depend upon adding a measure of existing worst case input slack for the selectively registerable portion as well as subtracting the amount of time needed to load an input value into the register associated with the selectively registerable portion.

In another aspect of the invention, the output slack for each selectively registerable portion can depend upon a product of a value indicating whether a register associated with the selectively registerable portion is used and an amount of time needed to send an output value from the register associated with the selectively registerable portion to an output of the logic block. The output slack for each selectively registerable portion further can depend upon adding a measure of existing worst case output slack for the selectively registerable portion as well as subtracting an amount of time needed to send the output value from the register associated with the selectively registerable portion to an output of the logic block.

In yet another aspect of the invention, the determining step can include defining a measure of worst case slack for a first pipeline stage as minimizing a function which depends upon a measure of input slack and a measure of output slack for each input port of the logic block having an available register. The determining step also can include defining a measure of worst case slack for a second pipeline stage as minimizing a function which depends upon a measure of input slack and a measure of output slack for internal logic of the logic block having an available register. The determining step further can include defining the measure of worst case slack for a third pipeline stage as minimizing a function which depends upon a measure of input slack and a measure of output slack for each output port of the logic block having an available register.

Another embodiment of the present invention can include a method of configuring a logic block of a PLD during physical implementation of a circuit design. The method can include measuring slack for a port of the logic block, wherein the port is selectively registered, and identifying a first location of a register associated with the port as internal or external with respect to the logic block. The register associated with the port can be moved to a second location according to a relocation technique. The method further can include determining whether slack for the port improves when the register associated with the port is moved to the second location as compared to the first location, and if so, accepting the second location of the register.

In one embodiment, the relocation technique can indicate that if the first location of the register associated with the port is within the logic block, the second location is external to the logic block. In another embodiment, the relocation technique can indicate that if the first location of the register associated with the port is external to the logic block, the second location is within the logic block.

Another embodiment of the present invention can include a machine readable storage, having stored thereon, a computer program having a plurality of code sections executable by a machine for causing the machine to perform the various steps disclosed herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

Embodiments of the present invention provide solutions for optimizing logic blocks of a programmable logic device (PLD). Rather than optimizing the performance of a logic block as a standalone unit, timing driven optimization of the logic block can be performed. In accordance with the inventive arrangements disclosed herein, critical connections of the logic block can be analyzed. Based upon the timing analysis and the identification of critical connections of the logic block in relation to other portions of the circuit, register placement and/or usage within the logic block can be altered.

In one embodiment of the present invention, registers can be selectively enabled within various pipeline stages within the logic block to optimize performance with respect to timing. In another embodiment, registers can be moved into, or out from, the logic block to optimize performance. That is, registers can be moved from the surrounding fabric of the PLD and absorbed into the logic block. Alternatively, registers originally located within the logic block can be relocated to a position that is external to the logic block, i.e. such that the register(s) are implemented within the fabric of the PLD.

Figure 1A:
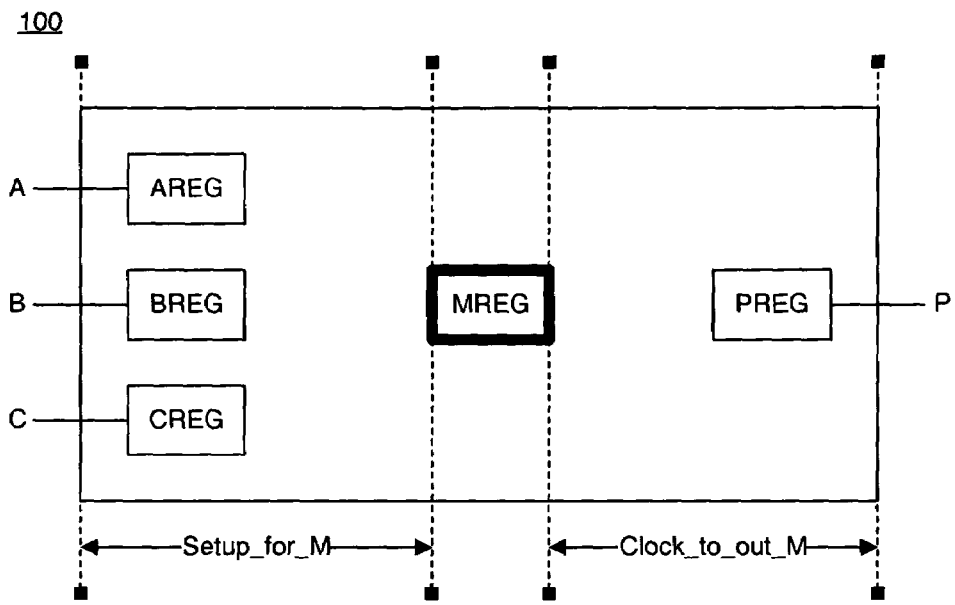
FIGS. 1A and 1B are schematic diagrams, each illustrating a simplified view of a logic block of a programmable logic device (PLD) which is useful for understanding one embodiment of the present invention.
Figure 1B:
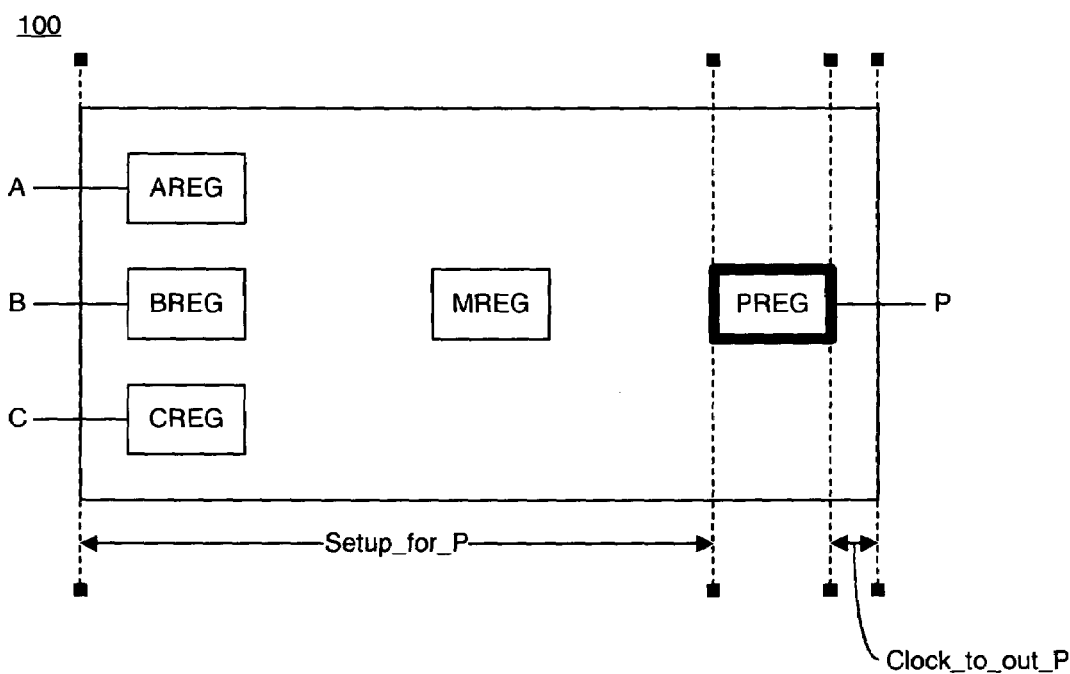

FIGS. 1A and 1B are schematic diagrams, each illustrating a simplified view of a logic block 100 of a PLD which is useful for understanding one embodiment of the present invention. Logic block 100 can represent any of a variety of different black boxes, i.e. logic blocks, for use with a PLD and/or a field programmable gate array (FPGA) that have pipelining capability.

Figure 1C:
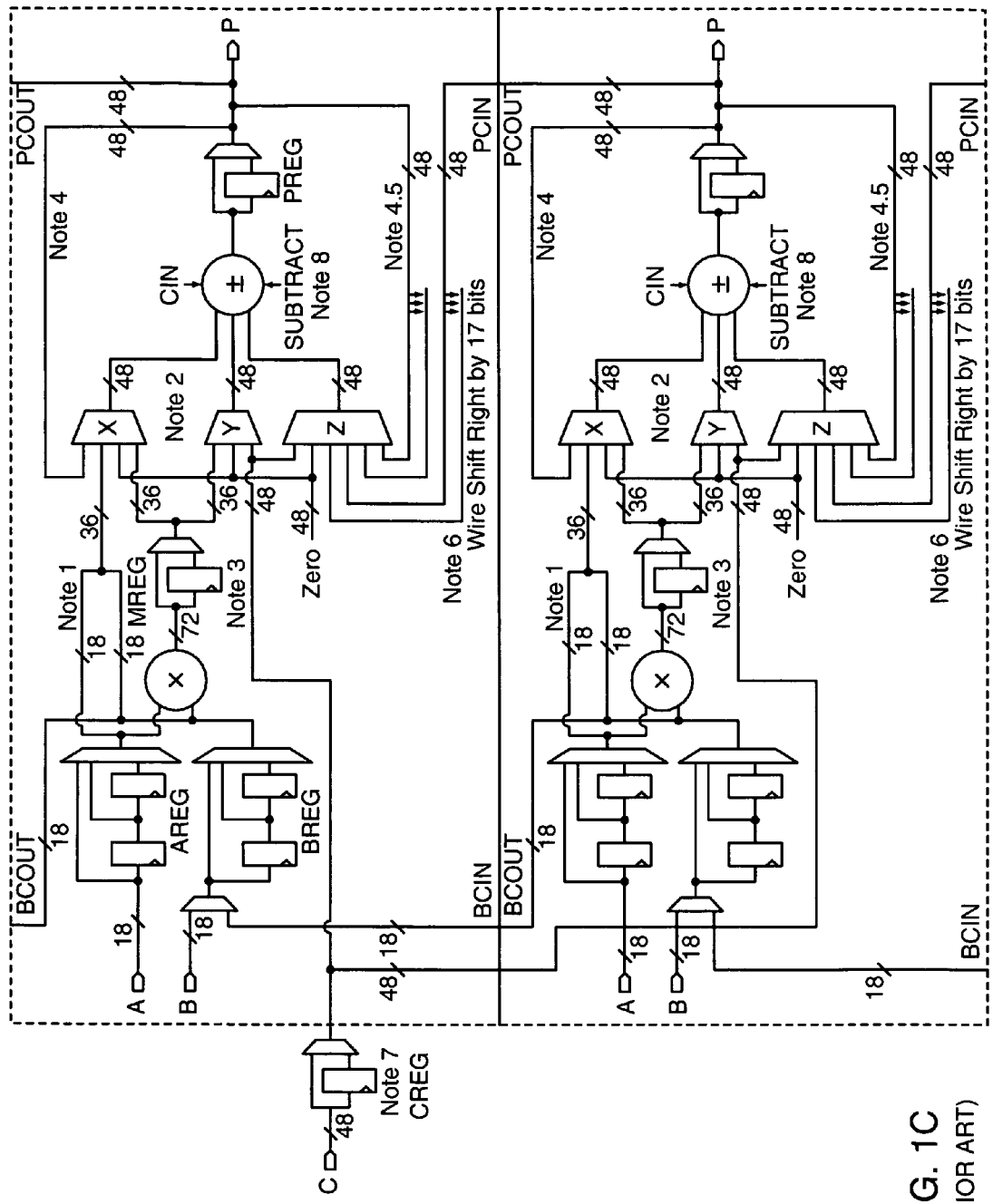
FIG. 1C shows two adjacent DSP blocks of the prior art.

In one embodiment, the PLD can be one of the Virtex4 family of FPGA's available from Xilinx, Inc. of San Jose, Calif. In that case, logic block 100 can be implemented as a DSP48 block. A DSP48 block is a multiply and accumulate block capable of performing arithmetic and logical operations. As noted, a DSP48 block combines an 18-bit by 18-bit signed multiplier with a 48-bit adder and a programmable multiplexer which allows input to be selected for the adder. A DSP48 block has three input data ports A, B, and C and an output port P. Port C is shared by two adjacent DSP48 blocks in a tile on an FPGA. FIG. 1C is taken from FIGS. 1-3 of page 19 of the XtremeDSP Design Considerations User Guide, UG073 (v1.2) Feb. 4, 2005 from Xilinx, Inc, which shows two adjacent DSP blocks. A DSP48 block, provides parameter settings which allow a developer to specify whether ports of the logic block are registered and the amount of pipelining used for a given port.

As shown, logic block 100, for example a DSP48 block, has a maximum of three stages of pipelining. The first stage is on the input side where all three data ports A, B, and C can be registered. Port A and port B have registers AREG and BREG respectively. These registers can have a pipeline depth of one or two. Port C has a single register CREG and is shared by two adjacent DSP48 blocks in the same tile. The second possible stage of pipelining refers to register MREG, which is located after partial multiplication in the logic block. MREG can be used, or is available, only when the multiplier logic is used, else MREG is bypassed. The third stage of pipelining within a DSP48 block is on the output of the logic block. Output port P can be registered with register PREG. Each of the registers of the logic block is optional in nature and can be bypassed by the user.

Rather than performing configuration and/or optimization of logic block 100 during the synthesis phase of circuit design when timing information is not readily available, configuration and/or optimization can be performed during physical implementation, i.e. during map, place, and route. In accordance with one embodiment of the present invention, an analysis of the input and/or output slacks of one or more selectively registerable portions of logic block 100 can be performed. Based upon this analysis, register settings which dictate register usage for one or more of the pipeline stages can be selected.

As used herein, slack refers to the difference between a target delay of a signal path and the calculated, or determined, signal path delay. In general, the target delay is a design constraint or goal, whereas the determined delay is an estimate of the actual delay as calculated by a circuit design and/or simulation tool. Accordingly, the slack for a given path, or in this case port, can be determined by subtracting the estimated actual delay of a path from the target delay for the path.

A path slack less than zero indicates a path having a path delay greater than the target delay. A critical path can be any path, or port, having a slack that meets or exceeds a predetermined value. For example, critical paths can be those paths having negative slacks, indicating that the estimated actual delay of the path exceeds the target delay. Still, the invention is not limited to any particular threshold or metric for determining whether a given path is critical. For example, such determinations can be selected or configured by a user.

With reference to FIG. 1A, register MREG is configured for use in conjunction with an internal logic associated with the multiplier unit (not shown). A timing analysis performed on logic block 100 provides timing information such as variables Setup_or_M and Clock_to_out_M. The variable Setup_or_M indicates the amount of time needed to propagate a value into register MREG from the input ports, whether A, B, or C, of logic block 100. The variable Clock_to_out_M indicates the amount of time needed to propagate a value stored in MREG to the output port P of logic block 100.

For purposes of illustration, it can be assumed that a timing analysis performed on logic block 100, after initial placement, has provided estimated slacks for the input ports and output ports of logic block 100. The estimated slacks indicate that the output is critical and that the input slacks are positive. Using this information, logic block 100 can be optimized with respect to register placement and/or usage from a timing driven perspective. In general, the time denoted by the variable Clock_to_out_M should be reduced so that the output of logic block 100 is no longer considered critical.

FIG. 1B illustrates a configuration of logic block 100 after optimization has been performed in accordance with one embodiment of the present invention. As shown, MREG is no longer used or enabled. Instead, PREG on output P is enabled. FIG. 1B illustrates that the setup time needed to load PREG, indicated by Setup_or_P, is greater than the time required to setup MREG, as indicated by Setup_for_M. The input ports, however, have enough positive slack to allow this transformation without placing the input ports in a critical path. The time needed to provide a value stored in PREG to the output of logic block 100, denoted as Clock_to_out_P, is less than the time indicated by Clock_to_out_M. By utilizing PREG rather than MREG, effectively moving the register location on the path through logic block 100 closer to the output port P, the clock to output value, now computed with respect to PREG rather than MREG, has been reduced. The clock to output value has been reduced to an acceptable range and the output port which is no longer considered critical.

It should be appreciated that while DSP48 blocks are referenced throughout this specification, reference has been made to DSP48 blocks for purposes of illustration only. As such, the use of a particular type of logic block, in this case a DSP48 block, is not intended to limit the scope of the present invention in any way. Rather, as noted, the present invention can be applied to any of a variety of different logic blocks which have pipelining capability and/or include registers which can be selectively enabled for various input, internal, and/or output ports.

Figure 2:
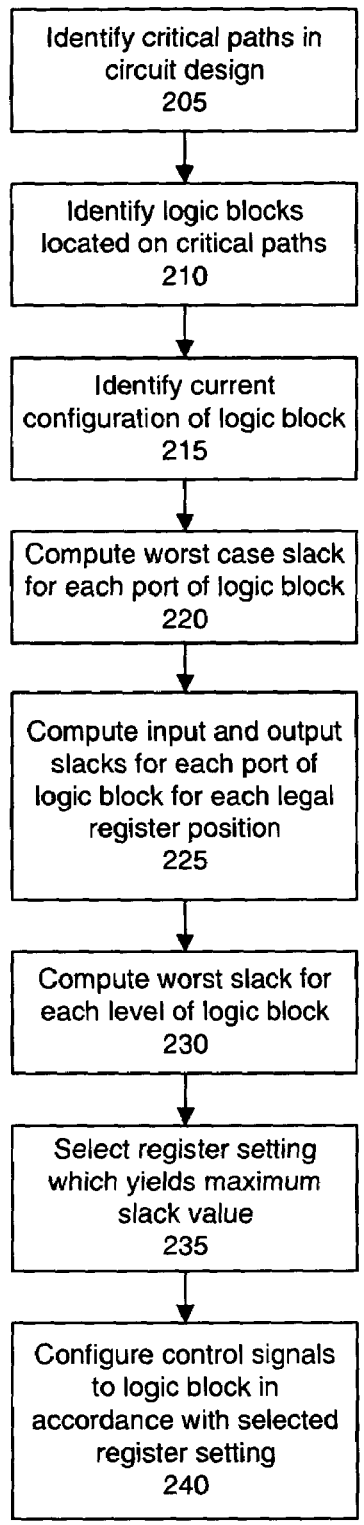
FIG. 2 is a flow chart illustrating a method of logic block optimization in accordance with one embodiment of the present invention.

FIG. 2 is a flow chart illustrating a method 200 of logic block optimization in accordance with one embodiment of the present invention. Method 200 illustrates a technique for logic block retiming which can be used to optimize logic blocks having one or more ports that can be selectively registered. In one embodiment of the present invention, method 200 can be implemented using a software-based circuit design tool executing within a suitable information processing system. Further, as noted, method 200 can be performed during the physical implementation stage of circuit design, when timing information for the circuit has been determined and is available for use during optimization and/or configuration of logic blocks.

Method 200 can begin in step 205 where critical paths of a circuit design to be implemented on a target PLD can be identified. In step 210, any logic blocks, for example DSP48 blocks, located on critical paths of the circuit design can be identified. In step 215, the current configuration of the logic block can be identified. The current configuration, for example, can specify register usage and/or other parameters for the logic block. More particularly, the current configuration can indicate which portions of the logic block are registered as well as the pipelined depth of such registered portions (i.e., where in one embodiment a registered portion includes one or more registers coupled in series, and were the series coupled registers may have optional bypasses using multiplexers). In step 220, an estimate of worst case slack can be computed for each of the selectively registerable portions of the logic block. In step 225, estimates of input and output slacks for each selectively registerable portion of the logic block can be determined.

With reference to the DSP48 block, for example, the input slack for selectively registerable port A, when AREG is set, can be computed as follows:

Input Slack
$A$=Existing_Worst_Case_Input_Slack_Port_$A$+
($AREG_{used}$*Setup_for_$AREG$+
$MREG_{used}$*Setup_or_$MREG$+
$PREG_{used}$*Setup_or_$PREG$)−Setup_or_$AREG$ The output slack for port A, when AREG is set, can be computed as follows:

Output Slack
$A$=Existing_Worst_Case_Output_Slack_Port_
$P$+($AREG_{used}$*Clock_to_out_$AREG$+
$MREG_{used}$*Clock_to_out_$MREG$+
$PREG_{used}$*Clock_to_out_$PREG$)−
Clock_to_out_$AREG$ Prior to performing any timing driven optimizations, initial register configurations of the logic block are recorded. With reference to the above computations, the variable $AREG_{used}$ is set based upon whether register AREG is configured. If register AREG is configured, $AREG_{used}$ is set to 1. If not, the value of $AREG_{used}$ is set to 0. The variable Setup_or_$AREG$ refers to the amount of time needed to load the AREG register once an input signal or value is received. The variable Clock_to_out_$AREG$ refers to the amount of time needed to propagate a signal or value from the AREG register to the output of the logic block, i.e. through output port P. Values for the other variables can be determined in similar fashion with respect to the particular portion of the logic block to which the variable relates or is associated, i.e. $MREG_{used}$ and $PREG_{used}$. Similarly, input and output slacks for other selectively registerable portions of the logic block, i.e. ports B, C, and P and the internal logic portion relating to MREG, can be computed as described with reference to port A.

Continuing with step 225, the input and output slacks of each selectively registerable portion of the logic block are determined for each legal register position available within the logic block. In illustration, with reference to the DSP48 block, several rules are to be observed in terms of register usage and legal register positions. The following is not intended to be an exhaustive discussion of the rules that must be observed when configuring a DSP48 block with respect to registering ports, but rather to serve as examples of allowable, or legal, register positions. It should be appreciated that any architecture may have a corresponding set of restrictions that must be observed for purposes of device configuration.

If, for example, a DSP48 block does not use the multiplier hardware logic, then MREG is bypassed. In that case, MREG would not be a legal, or available, register position. In another example, in the single pipeline case where the input side of a DSP48 block is cascaded, the possible register positions are only MREG and PREG. Were registers placed into AREG and PREG, timing for the cascaded block would be affected. Thus, when the input side of the DSP48 block is cascaded, no optimization of AREG and BREG is performed. If the output side of a DSP48 block is cascaded, the legal register placement positions are only AREG, BREG, and MREG.

In step 230, the worst slack for each of stages 1, 2, and 3 of the logic block can be calculated. With respect to stage 1, the worst case slack, referred to as WorstSlack1, can be defined as MIN(InputSlack$_{AREG}$, OutputSlack$_{AREG}$, InputSlack$_{BREG}$, OutputSlack$_{BREG}$). That is, the worst case slack of stage 1 can be defined as the minimum of the input slack of AREG, the output slack of AREG, the input slack of BREG, or the output slack of BREG. For stage 2, the worst case slack, referred to as WorstSlack2, can be defined as MIN(InputSlack$_{MREG}$, OutputSlack$_{MREG}$). For stage 3, the worst case slack, referred to as WorstSlack3, can be defined as MIN(InputSlack$_{PREG}$, OutputSlack$_{PREG}$).

In step 235, the legal register position which yields the maximum slack values is selected. This register position provides optimized performance with respect to timing. The maximum slack, denoted as BestSlack, can be defined as MAX(WorstSlack1, WorstSlack2, WorstSlack3). The legal register position which satisfies the BestSlack definition can be selected. The logic block can be configured in accordance with the selected register setting. The selected register setting for the logic block can be the same as the initial configuration of the logic block or can be different. Once a port configuration is selected, control signals can be rewired as may be required.

Figure 3:
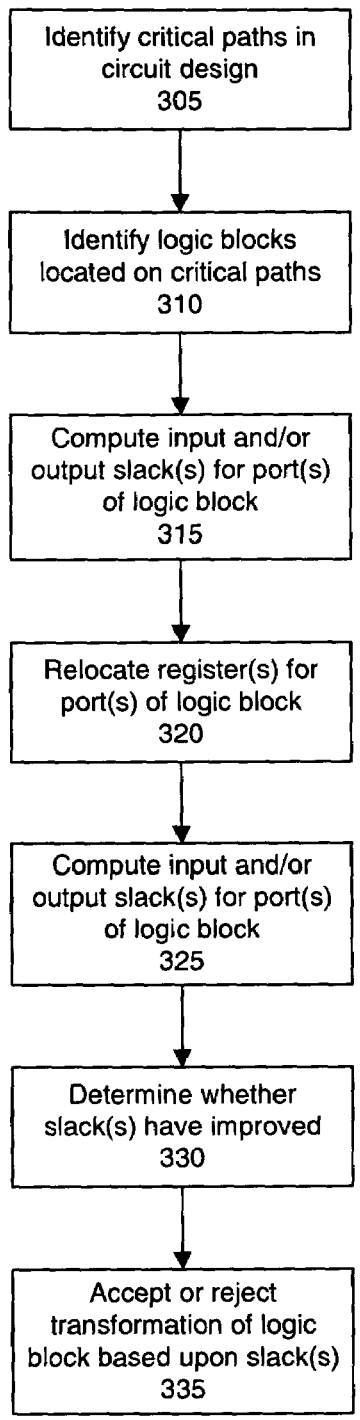
FIG. 3 is a flow chart illustrating a method of logic block optimization in accordance with another embodiment of the present invention.

FIG. 3 is a flow chart illustrating a method 300 of logic block optimization in accordance with another embodiment of the present invention. Method 300 illustrates an embodiment in which registers of ports of a logic block can be selectively relocated or moved either into or out from the logic block to be configured and/or optimized. Similar to method 200, method 300 can be implemented using a software-based circuit design tool executing on a suitable information processing system. Also, method 300 can be performed during the physical implementation stage of the circuit design process.

Method 300 can begin in step 305 where critical paths of a circuit design to be implemented on a PLD can be identified. In step 310, any logic blocks, for example DSP blocks, located on critical paths can be identified. In step 315, input and/or output slacks for the logic block(s) can be calculated. In step 320, the registers of one or more ports of the logic block can be relocated. More particularly, if the ports of the logic block have one or more registers located within the logic block, one or more of the registers can be moved to locations external to the logic block. In that case, such register(s) can be implemented in the fabric of the PLD rather than within, or as part of, the logic block. Similarly, if the port(s) of the logic block have one or more registers located external to the logic block, the register(s) can be absorbed into the logic block. That is, the register(s) are no longer implemented using the fabric of the PLD, but rather are moved to location(s) within the logic block.

In illustration, in the case where one or more registers are located external to the logic block and drive port A, and AREG is unused, the existing worst case slack can be calculated for input port A of the logic block. The register(s) external to the logic block can be relocated internal to the logic block by deleting signals connecting the output of the registers to port A, replacing outputs of signals originally connected between the external register(s) and port A, and configuring the logic block to use AREG.

In any case, in step 325, the input and/or output slacks of the ports of the logic block can be calculated again after, for example, performing an optimization using method 200. In step 330, a determination can be made as to whether the slack(s) of the logic block have improved as a result of the relocation of the register(s) of the logic block. In step 335, if the slack(s) of the logic block have improved, the transformation, or configuration, of the logic block, with respect to the location of the registers, can be accepted. If the slack(s) do not improve, the transformation can be rejected and the initial configuration can be maintained. In illustration, for the optimized configuration, a new worst case slack can be computed as the maximum of the new worst case input slack and the new worst case output slack. The new configuration can be accepted if the new worst case slack is less than the existing worst case slack. It should be appreciated that further timing driven optimization of the variety described with reference to FIG. 2 also can be performed.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of configuring a logic block of an integrated circuit during physical implementation of a circuit design, wherein portions of the logic block are selectively registered, said method comprising:
   identifying the logic block of the integrated circuit, wherein the logic block is located on a critical path, wherein the logic block comprises dedicated circuitry that performs a particular function and comprises a plurality of selectively registerable stages, wherein each stage comprises at least one register that is selectively bypassed;
   for each of the plurality of selectively registerable stages of the logic block, determining a measure of worst case slack for legal register settings for the logic block, wherein each legal register setting specifies which of the at least one register of each selectively registerable stage is bypassed; and
   selecting a legal register setting that yields a maximum slack according to a function that depends upon the measures of worst case slack for each respective stage of the logic block.

2. The method of claim 1, wherein the worst case slack of each stage is determined according to an input slack for each selectively registerable stage that depends upon a product of a value indicating whether a register associated with the selectively registerable stage is used and an amount of time needed to load an input value into the register associated with the selectively registerable stage.

3. The method of claim 2, wherein the input slack for each selectively registerable stage further depends upon adding a measure of existing worst case input slack for the selectively registerable stage.

4. The method of claim 3, wherein the input slack for each selectively registerable stage further depends upon subtracting the amount of time needed to load an input value into the register associated with the selectively registerable stage.

5. The method of claim 1, wherein the worst case slack of each stage is determined according to an output slack that depends upon a product of a value indicating whether a register associated with the selectively registerable stage is used and an amount of time needed to send an output value from the register associated with the selectively registerable stage to an output of the logic block.

6. The method of claim 5, wherein the output slack for each selectively registerable stage further depends upon adding a measure of existing worst case output slack for the selectively registerable stage portion.

7. The method of claim 6, wherein the output slack for each selectively registerable stage further depends upon subtracting an amount of time needed to send the output value from the register associated with the selectively registerable stage to an output of the logic block.

8. The method of claim 1, said selecting step further comprising defining the measure of worst case slack for a first stage as minimizing a function which depends upon a measure of input slack and a measure of output slack for each input port of the logic block having an available register.

9. The method of claim 8, said selecting step further comprising defining the measure of worst case slack for a second stage as minimizing a function which depends upon a measure of input slack and a measure of output slack for internal logic of the logic block having an available register.

10. The method of claim 9, said selecting step further comprising defining the measure of worst case slack for a third stage as minimizing a function which depends upon a measure of input slack and a measure of output slack for each output port of the logic block having an available register and wherein the logic block is a digital signal processing block.

11. A machine readable storage, having stored thereon a computer executable program having a plurality of code sections that configure a logic block of an integrated circuit, the machine readable storage comprising:
   computer executable program code that identifies a logic block of an integrated circuit, wherein the logic block is located on a critical path, wherein the logic block comprises dedicated circuitry that performs a particular function and comprises a plurality of selectively registerable stages, wherein each stage comprises at least one register that is selectively bypassed;
   computer executable program code that, for each of the plurality of selectively registerable stages of the logic block, determines a measure of worst case slack for legal register settings for the logic block, wherein each legal register setting specifies which of the at least one register of each selectively registerable stage is bypassed; and
   computer executable program code that selects a legal register setting that yields a maximum slack according to a function that depends upon the measures of worst case slack for each respective stage of the lock block stages.

12. The machine readable storage of claim 11, wherein the worst case slack of each stage is determined according to an input slack for each selectively registerable stage that depends upon a product of a value indicating whether a register associated with the selectively registerable stage is used and an amount of time needed to load an input value into the register associated with the selectively registerable stage.

13. The machine readable storage of claim 12, wherein the input slack for each selectively registerable stage further depends upon adding a measure of existing worst case input slack for the selectively registerable stage.

14. The machine readable storage of claim 13, wherein the input slack for each selectively registerable stage further depends upon subtracting the amount of time needed to load an input value into the register associated with the selectively registerable stage.

15. The machine readable storage of claim 11, wherein the worst case slack of each stage is determined according to an output slack for each selectively registerable stage that depends upon a product of a value indicating whether a register associated with the selectively registerable stage is used and an amount of time needed to send an output value from the register associated with the selectively registerable stage to an output of the logic block.

16. The machine readable storage of claim 15, wherein the output slack for each selectively registerable stage further depends upon adding a measure of existing worst case output slack for the selectively registerable stage.

17. The machine readable storage of claim 16, wherein the output slack for each selectively registerable stage further depends upon subtracting an amount of time needed to send the output value from the register associated with the selectively registerable stage to an output of the logic block and wherein the logic block includes one or more digital signal processing blocks.

* * * * *